(12) United States Patent
Yang et al.

(10) Patent No.: US 9,439,263 B2
(45) Date of Patent: Sep. 6, 2016

(54) PIXEL ARRANGEMENT OF COLOR DISPLAY PANEL

(71) Applicant: AU Optronics Corp., Hsin-Chu (TW)

(72) Inventors: Hsueh-Yen Yang, Hsin-Chu (TW); Hong-Shen Lin, Hsin-Chu (TW)

(73) Assignee: AU OPTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/989,798

(22) Filed: Jan. 7, 2016

(65) Prior Publication Data

US 2016/0120004 A1 Apr. 28, 2016

Related U.S. Application Data

(62) Division of application No. 14/308,719, filed on Jun. 19, 2014, now Pat. No. 9,262,957.

(30) Foreign Application Priority Data

Oct. 30, 2013 (TW) .............................. 102139384 A
May 2, 2014 (TW) .............................. 103115883 A

(51) Int. Cl.
*H05B 33/12* (2006.01)
*G09G 3/20* (2006.01)
*H01L 27/32* (2006.01)
*G09G 3/32* (2016.01)

(52) U.S. Cl.
CPC ............ *H05B 33/12* (2013.01); *G09G 3/2003* (2013.01); *H01L 27/3213* (2013.01); *H01L 27/3216* (2013.01); *H01L 27/3218* (2013.01); *G09G 3/3208* (2013.01); *G09G 2300/0452* (2013.01)

(58) Field of Classification Search
CPC ............... H05B 33/12; G09G 3/2003; G09G 2300/0426; G09G 2300/0439; G09G 2300/0452; H01L 27/3213; H01L 27/3216; H01L 27/3218
See application file for complete search history.

(56) References Cited

U.S. PATENT DOCUMENTS

| | | | |
|---|---|---|---|
| 6,714,206 B1 * | 3/2004 | Martin | ................ G09G 3/2003 345/589 |
| 7,129,634 B2 | 10/2006 | Boroson | |
| 7,248,314 B2 * | 7/2007 | Yun | .................. G02F 1/133514 349/106 |
| 7,515,122 B2 | 4/2009 | Miller | |

(Continued)

FOREIGN PATENT DOCUMENTS

| | | |
|---|---|---|
| CN | 1551383 A | 12/2004 |
| CN | 102142210 | 8/2011 |

*Primary Examiner* — Jonathan Boyd
*Assistant Examiner* — Sardis F Azongha
(74) *Attorney, Agent, or Firm* — Locke Lord LLP; Tim Tingkang Xia, Esq.

(57) ABSTRACT

A pixel arrangement of color display panel includes a plurality of first sub-pixels, second sub-pixels, third sub-pixels and fourth sub-pixels for respectively providing a first color light, a second color light, a third color light and a fourth color light. The first sub-pixels and the fourth sub-pixels respectively have the same first length and fourth length in a first direction. The second sub-pixels and the third sub-pixels respectively have the same second length and third length in the first direction, which are greater than the first length. The first and fourth sub-pixels are arranged along the first direction to form sub-pixel columns, wherein one of the first sub-pixels in one of the sub-pixel columns partially overlaps one of the first sub-pixels and one of the fourth sub-pixels in another sub-pixel column in a second direction perpendicular to the first direction.

5 Claims, 11 Drawing Sheets

(56) References Cited

U.S. PATENT DOCUMENTS

| | | | |
|---|---|---|---|
| 8,354,789 B2 | 1/2013 | Kim | |
| 8,552,635 B2 | 10/2013 | Kim | |
| 8,860,642 B2* | 10/2014 | Phan | H04N 9/30 345/589 |
| 9,318,033 B2* | 4/2016 | Matsui | G09F 13/04 |
| 9,324,262 B2* | 4/2016 | Kim | G09G 3/3208 |
| 2004/0051724 A1* | 3/2004 | Elliott | G02F 1/133514 345/694 |
| 2004/0217694 A1 | 11/2004 | Cok | |
| 2005/0270444 A1 | 12/2005 | Miller | |
| 2007/0091043 A1* | 4/2007 | Rho | G02F 1/133514 345/88 |
| 2008/0049048 A1* | 2/2008 | Credelle | G09G 3/2074 345/690 |
| 2008/0084376 A1* | 4/2008 | Hirota | G09G 3/3607 345/88 |
| 2009/0121983 A1 | 5/2009 | Sung | |
| 2011/0291550 A1* | 12/2011 | Kim | G09G 3/2003 313/504 |
| 2012/0268357 A1* | 10/2012 | Shih | G09G 3/3607 345/88 |
| 2014/0204008 A1* | 7/2014 | Chu-Ke | G09G 3/2003 345/88 |

* cited by examiner

| P1 | P2 | P3 |
|----|----|----|
| P4 | P5 | P6 |
| P7 | P8 | P9 |

FIG. 11

PIXEL ARRANGEMENT OF COLOR DISPLAY PANEL

CROSS REFERENCE TO RELATED APPLICATIONS

This application is a division of U.S. application Ser. No. 14/308,719 filed on Jun. 19, 2014, which is incorporated herein by reference in its entirety.

BACKGROUND OF THE INVENTION

1. Field of the Invention

The present invention relates to a pixel arrangement of color display panel, and more particularly, to a pixel arrangement of color display panel with high resolution.

2. Description of the Prior Art

Organic light-emitting diode (OLED) display panel is expected to be a mainstream of flat display panels in the next generation for its advantages of self-luminous, high contrast ratio, slimness and wide viewing angle. The pixel arrangement of convention OLED display panel is composed of sub-pixels of three different primary colors such as red sub-pixels, green sub-pixels and blue sub-pixels, and the full color display effect can be achieved by adjusting grayscales of red light, green light and blue light. The conventional pixel arrangement of OLED display panel, however, suffers from low brightness for the image is composed of red light, green light and blue light. In another conventional pixel arrangement of OLED display panel, white sub-pixels are used in addition to red sub-pixels, green sub-pixels and blue sub-pixels, i.e. each pixel unit is composed of four sub-pixels including a red sub-pixel, a green sub-pixel, a blue sub-pixel and a white sub-pixel. The resolution is reduced, which deteriorates display quality.

SUMMARY OF THE INVENTION

It is therefore one of the objectives of the present invention to provide a pixel arrangement of color display panel with high brightness and high resolution.

According to an embodiment of the present invention, a pixel arrangement of color display panel is provided. The pixel arrangement of color display panel includes a plurality of first sub-pixels, second sub-pixels, third sub-pixels and white sub-pixels. The first sub-pixels are configured to provide a first color light, wherein the first sub-pixels extend along a first direction and form a plurality of first sub-pixel columns substantially arranged in parallel, and the first sub-pixel has a first length in the first direction. The second sub-pixels are disposed between two adjacent first sub-pixel columns and configured to provide a second color light, wherein the second sub-pixel has a second length in the first direction. The third sub-pixels are disposed between two adjacent first sub-pixel columns and configured to provide a third color light, wherein the third sub-pixel has a third length in the first direction. The white sub-pixels are disposed between two adjacent first sub-pixel columns and configured to provide a white light, wherein the white sub-pixels extend along the first direction and form a plurality of white sub-pixel columns arranged substantially in parallel, the white sub-pixel column is disposed between two adjacent first sub-pixel columns, and the white sub-pixel has a fourth length in the first direction.

According to another embodiment of the present invention, a pixel arrangement of color display panel is provided. The pixel arrangement of color display panel includes a plurality of white sub-pixels, first sub-pixels, second sub-pixels and third sub-pixels. The white sub-pixels are configured to provide a white light, wherein the white sub-pixels extend along a first direction and form a plurality of white sub-pixel columns, and the white sub-pixel has a fourth length in the first direction. The first sub-pixels are disposed between the white sub-pixel columns and configured to provide a first color light, wherein the first sub-pixel has a first length in the first direction. The second sub-pixels are disposed between the white sub-pixel columns and configured to provide a second color light, wherein the second sub-pixel has a second length in the first direction. The third sub-pixels are disposed between the white sub-pixel columns and configured to provide a third color light, wherein the third sub-pixel has a third length in the first direction, a portion of the first sub-pixels, the second sub-pixels and the third sub-pixels are arranged along the first direction and form a plurality of first sub-pixel columns arranged substantially in parallel, the first sub-pixels, the second sub-pixels and the third sub-pixels of the first sub-pixel column are repeatedly arranged in a sequence of the second sub-pixel, the first sub-pixel, the third sub-pixel and the first sub-pixel, the other portion of the first sub-pixels, the second sub-pixels and the third sub-pixels are arranged along the first direction and form a plurality of second sub-pixel columns arranged substantially in parallel, and the first sub-pixels, the second sub-pixels and the third sub-pixels of the second sub-pixel column are repeatedly arranged in a sequence of the third sub-pixel, the first sub-pixel, the second sub-pixel and the first sub-pixel. The first length is substantially equal to the second length, the second length is substantially equal to the third length, the fourth length is greater than the first length, and the first sub-pixel of the first sub-pixel column entirely overlap the first sub-pixel of the second sub-pixel column in a second direction perpendicular to the first direction.

According to still another embodiment of the present invention, a pixel arrangement of color display panel is provided. The pixel arrangement of color display panel includes a plurality of first sub-pixels, second sub-pixels, third sub-pixels and fourth sub-pixels. The first sub-pixels are configured to provide a first color light, wherein the first sub-pixel has a first length in a first direction. The second sub-pixels are configured to provide a second color light, wherein the second sub-pixel has a second length in the first direction. The third sub-pixels are configured to provide a third color light, wherein the third sub-pixel has a third length in the first direction. The fourth sub-pixels are configured to provide a fourth light, wherein the fourth sub-pixel has a fourth length in the first direction, the first length is substantially equal to the fourth length, the second length is substantially equal to the third length, and the second length is greater than the first length. A portion of the first sub-pixels and a portion of the fourth sub-pixels are arranged along the first direction and form a plurality of first sub-pixel columns, and the first sub-pixels and the fourth sub-pixels of the first sub-pixel column are repeatedly arranged in a sequence of the first sub-pixel, the fourth sub-pixel and the first sub-pixel in the first direction. The other portion of the first sub-pixels and the other portion of the fourth sub-pixels are arranged along the first direction and form a plurality of fourth sub-pixel columns, and the first sub-pixels and the fourth sub-pixels of the fourth sub-pixel column are repeatedly arranged in a sequence of the first sub-pixel, the fourth sub-pixel and the first sub-pixel in the first direction, and any one of the first sub-pixels of the first sub-pixel column partially overlaps one of the first sub-pixels and one of the fourth sub-pixels of the fourth sub-pixel column in a second direction perpendicular to the first direction. A portion of the second sub-pixels and a portion of the third sub-pixels are arranged along the first direction and form a plurality of second sub-pixel columns, and the second sub-pixels and the third sub-pixels of the second sub-pixel column are repeatedly arranged in a sequence of the second sub-pixel and the third sub-pixel in the first direction. The other portion of the second sub-pixels and the other portion of the third sub-pixels are arranged along the first direction and form a plurality of third sub-pixel columns, and the second sub-pixels and the third sub-pixels of the third sub-pixel column are repeatedly arranged in a sequence of the third sub-pixel and the second sub-pixel in the first direction. The first sub-pixel columns, the second sub-pixel columns, the third sub-pixel columns and the fourth sub-pixel columns are repeatedly arranged in a sequence of the second sub-pixel column, the first sub-pixel column, the third sub-pixel column and the fourth sub-pixel column in the second direction.

The pixel arrangement of color display panel of the present invention includes green sub-pixels, red sub-pixels, blue sub-pixels and white sub-pixels, and adjacent pixel units shares at least one sub-pixel. Consequently, the brightness can be increased through white sub-pixels without sacrificing resolution. In addition, the pixel arrangement of color display panel of the present invention is able to support pixel rendering and/or white sharing mechanisms.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 11 is a schematic diagram illustrating nine adjacent pixel units of the pixel arrangement of color display panel of the present invention.

DETAILED DESCRIPTION

Figure 1:
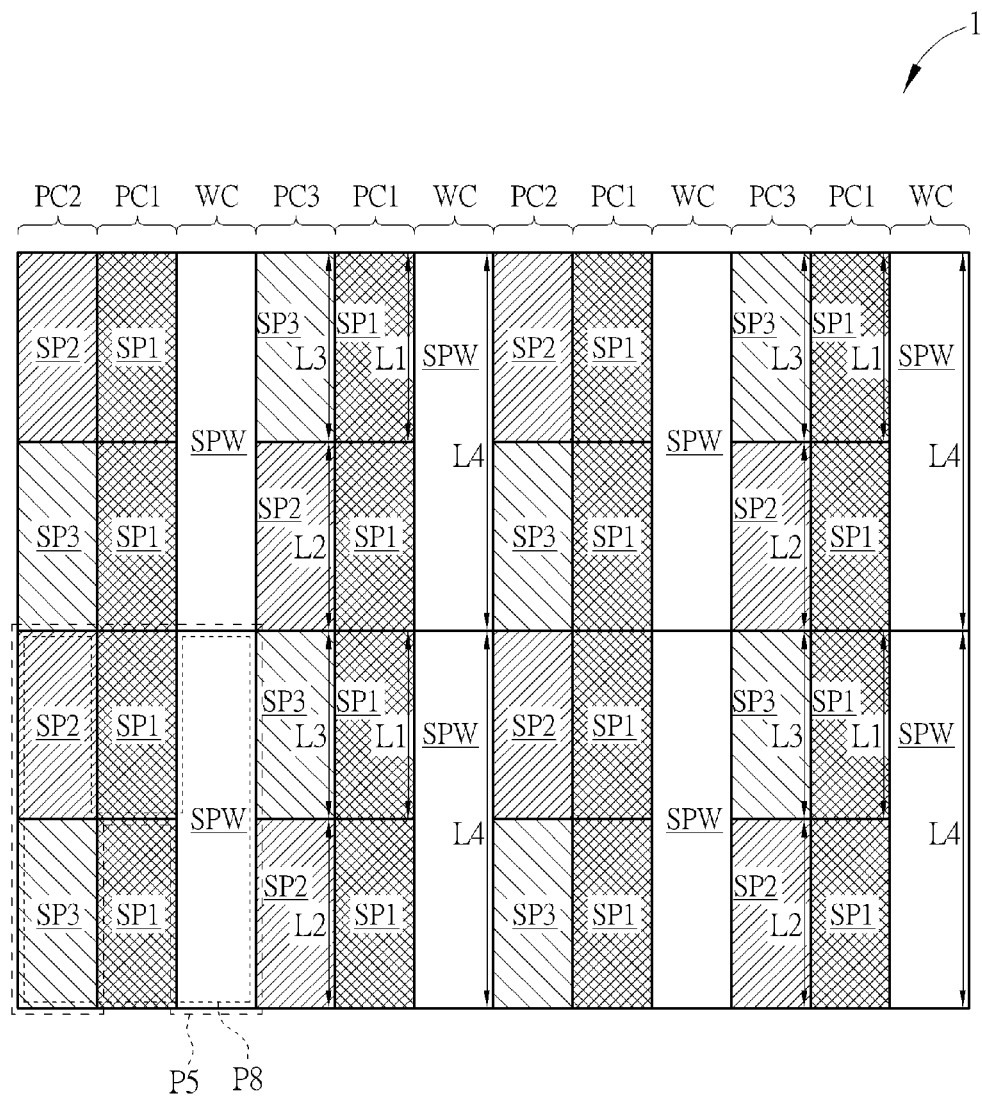
FIG. 1 is a schematic diagram illustrating a pixel arrangement of color display panel according to a first embodiment of the present invention.

Refer to FIG. 1. FIG. 1 is a schematic diagram illustrating a pixel arrangement of color display panel according to a first embodiment of the present invention. As shown in FIG. 1, the pixel arrangement 1 of color display panel of this embodiment includes a plurality of first sub-pixels SP1, second sub-pixels SP2, third sub-pixels SP3 and white sub-pixels SPW. The first sub-pixels SP1 are configured to provide a first color light, the second sub-pixels SP2 are configured to provide a second color light, the third sub-pixels SP3 are configured to provide a third color light and the white sub-pixels SPW are configured to provide a white color light. In the present invention, the first color light is preferably a green light, the second color light is preferably a red light and the third color light is a preferably blue light, i.e. the first sub-pixels SP1 are green sub-pixels, the second sub-pixels SP2 are red sub-pixels and the third sub-pixels SP3 are blue sub-pixels, but not limited thereto. In one configuration, the first sub-pixels SP1, the second sub-pixels SP2, the third sub-pixels SP3 and the white sub-pixels SPW may include one or more white light-emitting devices e.g. OLED devices, respectively, and the first sub-pixels SP1, the second sub-pixels SP2 and the third sub-pixels SP3 may include color filters (not shown) of different colors respectively (e.g. red color filters, green color filters and blue color filters), while the white sub-pixels SPW do not include color filters. Alternatively, the white sub-pixels SPW may include blueish color filters or yellowish color filters through which the emitting light of the white sub-pixels SPW is still whitish (e.g. blueish white or yellowish white). In another configuration, the first sub-pixels SP1, the second sub-pixels SP2, the third sub-pixels SP3 and the white sub-pixels SPW may include one or more green light-emitting devices (e.g. green OLED devices), red light-emitting devices (red OLED devices), blue light-emitting devices (blue OLED devices) and white light-emitting devices (white OLED devices) respectively without any color filters.

In this embodiment, the first sub-pixels SP1 extend along a first direction D1 and form a plurality of first sub-pixel columns PC1 substantially arranged in parallel, and the first sub-pixel SP1 has a first length L1 in the first direction D1. The second sub-pixels SP2 are disposed between two adjacent first sub-pixel columns PC1, and the second sub-pixel SP2 has a second length L2 in the first direction D1. The third sub-pixels SP3 are disposed between two adjacent first sub-pixel columns PC1, and the third sub-pixel SP3 has a third length L3 in the first direction D1. The white sub-pixels SPW are disposed between two adjacent first sub-pixel columns PC1, and the white sub-pixels SPW extend along the first direction D1 and form a plurality of white sub-pixel columns WC arranged substantially in parallel. The white sub-pixel column WC is disposed between two adjacent first sub-pixel columns PC1, the white sub-pixel SPW has a fourth length L4 in the first direction D1, and the fourth length L2 is greater than the first length L1. In addition, a portion of the second sub-pixels SP2 and a portion of the third sub-pixels SP3 are alternately and repeatedly arranged in a sequence of the second sub-pixel SP2 and the third sub-pixel SP3 in the first direction D1 and form a plurality of second sub-pixel columns PC2 arranged substantially in parallel; the other portion of the second sub-pixels SP2 and the other portion of the third sub-pixels SP3 are alternately and repeatedly arranged in a sequence of the third sub-pixel SP3 and the second sub-pixel SP2 in the first direction D1 and form a plurality of third sub-pixel columns PC3 arranged substantially in parallel. The first sub-pixel columns PC1, the second sub-pixel columns PC2, the third sub-pixel columns PC3 and the white sub-pixel columns WC are alternately and repeatedly arranged in a sequence of the second sub-pixel column PC2, the first sub-pixel column PC1, the white sub-pixel column WC, the third sub-pixel column PC3, the first sub-pixel column PC1 and the white sub-pixel column WC along a second direction D2 perpendicular to the first direction D1. In the present invention, the first direction D1 is a column direction (i.e. Y direction), and the second direction D2 is a row direction (i.e. X direction), but not limited thereto. For example, the first direction D1 may be a row direction, and the second direction D2 may be a column direction. Specifically, in the second direction D2, the 6n-5$^{th}$ sub-pixel columns are the second sub-pixel columns PC2, the 6n-4$^{th}$ sub-pixel columns and the 6n-1$^{th}$ sub-pixel columns are the first sub-pixel columns PC1, the 6n-3$^{rd}$ sub-pixel columns and the 6n$^{th}$ sub-pixel columns are the white sub-pixel columns WC, and the 6n-2$^{th}$ sub-pixel columns are the third sub-pixel columns PC3, where n is integers greater than 1. In the first direction D1, all sub-pixels of the first sub-pixel columns PC1 are the first sub-pixels SP1, and all sub-pixels of the white sub-pixel columns WC are the white sub-pixels SPW; the 2m-1$^{th}$ sub-pixels of the second sub-pixel columns PC2 are the second sub-pixels SP2, and the 2 m$^{th}$ sub-pixels of the second sub-pixel columns PC2 are the third sub-pixels SP3; the 2m-1$^{th}$ sub-pixels of the third sub-pixel columns PC3 are the third sub-pixels SP3, and the 2 m$^{th}$ sub-pixels of the third sub-pixel columns PC3 are the second sub-pixels SP2, where m is integers greater than 1. In this embodiment, the second length L2 is substantially equal to the third length L3, the first length L1 is substantially equal to the second length L2, the fourth length L4 is greater than the first length L1, and the fourth length L4 is substantially equal to a sum of two first lengths L1. In addition, each of the first sub-pixels SP1 entirely overlaps one of the second sub-pixels SP2 in the second direction D2, each of the first sub-pixels SP1 entirely overlaps one of the third sub-pixels SP3 in the second direction D2, each of the white sub-pixels SPW entirely overlaps two of the first sub-pixels SP1 in the second direction D2, and each of the white sub-pixels SPW entirely overlaps one of the second sub-pixels SP2 and one of the third sub-pixels SP3 in the second direction D2. Also, in the second direction D2, the first sub-pixel SP1, the second sub-pixel SP2, the third sub-pixel SP3 and the white sub-pixel SPW may have the same width or different widths. The shape of the first sub-pixel SP1, the second sub-pixel SP2, the third sub-pixel SP3 and the white sub-pixel SPW may be rectangular, rhombus, triangle or other appropriate geometrical shape.

The pixel arrangement of color display panel is not limited by the aforementioned embodiment, and may have other different preferred embodiments. To simplify the description, the identical components in each of the following embodiments are marked with identical symbols. For making it easier to compare the difference between the embodiments, the following description will detail the dissimilarities among different embodiments and the identical features will not be redundantly described.

Figure 2:
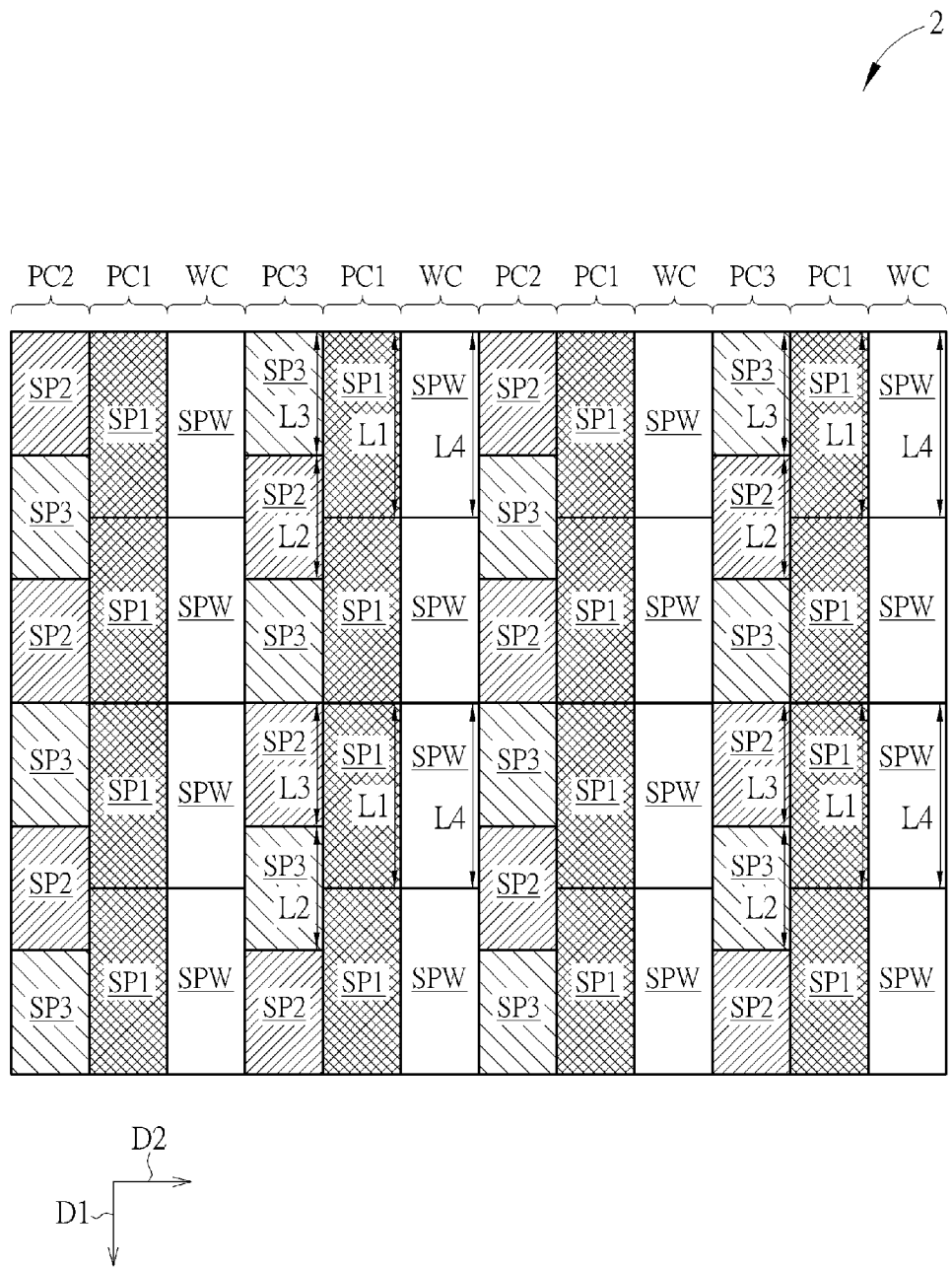
FIG. 2 is a schematic diagram illustrating a pixel arrangement of color display panel according to a second embodiment of the present invention.

Refer to FIG. 2. FIG. 2 is a schematic diagram illustrating a pixel arrangement of color display panel according to a second embodiment of the present invention. As shown in FIG. 2, the relative position of the first sub-pixel SP1, the second sub-pixel SP2, the third sub-pixel SP3 and the white sub-pixel SPW in the pixel arrangement 2 of color display panel in this embodiment is similar to that of the first embodiment, but the second length L2 of the second sub-pixel SP2, the third length L3 of the third sub-pixel SP3 and the fourth length L4 of the white sub-pixel SPW are different from that of the first embodiment. Specifically, in this embodiment, the second length L2 is substantially equal to the third length L3, the first length L1 is greater than the second length L2, and the fourth length L4 is substantially equal to the first length L1. In addition, the first length L1 is less than a sum of the second length L2 and the third length L3, a sum of two first lengths L1 is substantially equal to a sum of three second lengths L2 (or substantially equal to a sum of three third lengths L3). Moreover, two adjacent first sub-pixels SP1 entire overlap two of the second sub-pixels SP2 and one of the third sub-pixels SP3 in the second direction D2, and each of the white sub-pixels SPW entirely overlaps one of the first sub-pixels SP1 in the second direction D2.

Figure 3:
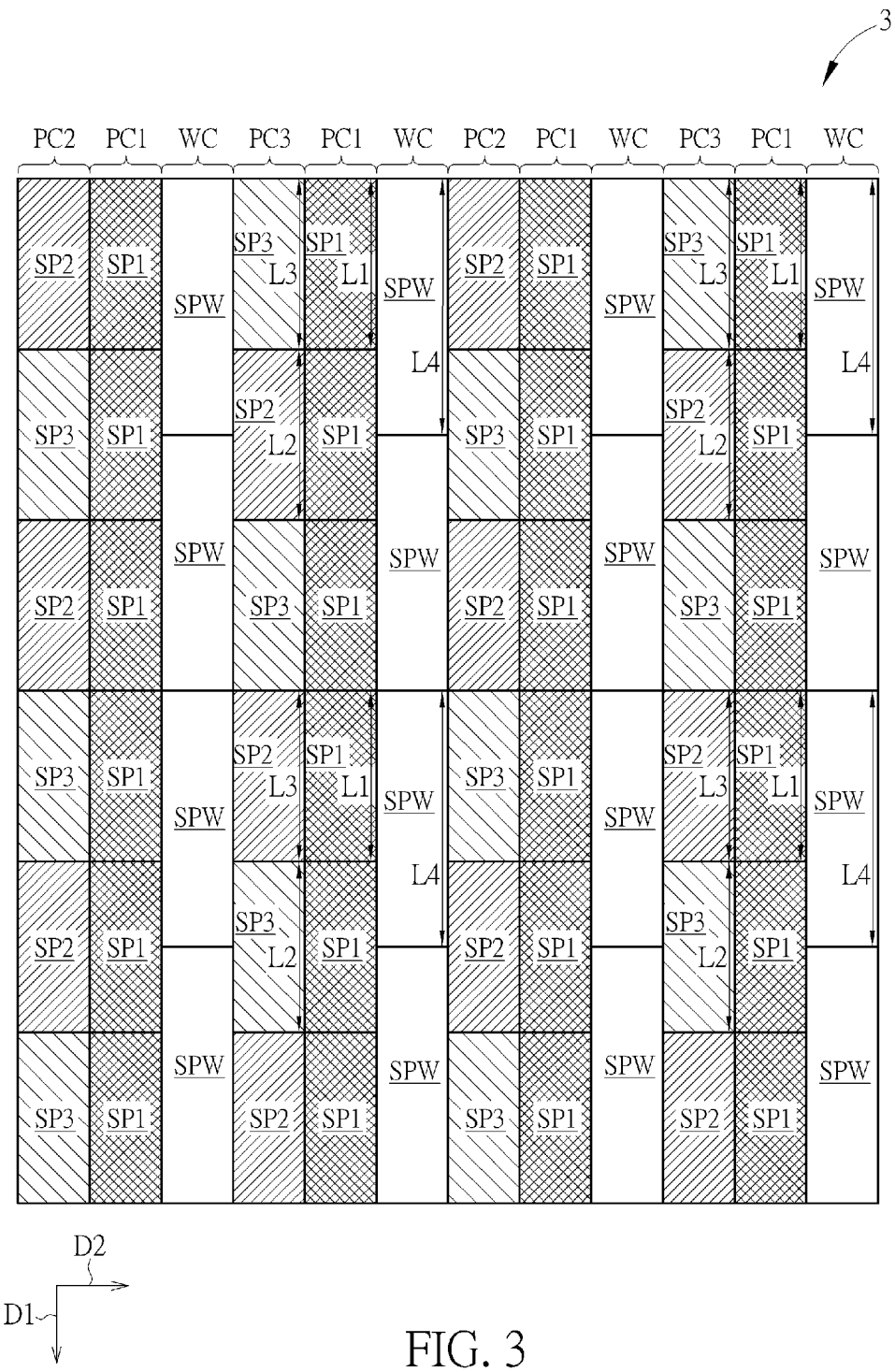
FIG. 3 is a schematic diagram illustrating a pixel arrangement of color display panel according to a third embodiment of the present invention.

Refer to FIG. 3. FIG. 3 is a schematic diagram illustrating a pixel arrangement of color display panel according to a third embodiment of the present invention. As shown in FIG. 3, the relative position of the first sub-pixel SP1, the second sub-pixel SP2, the third sub-pixel SP3 and the white sub-pixel SPW in the pixel arrangement 2 of color display panel in this embodiment is similar to that of the first embodiment, but the fourth length L4 of the white sub-pixel SPW is different from that of the first embodiment. Specifically, the second length L2 is substantially equal to the third length L3, the first length L1 is substantially equal to the second length L2, the fourth length L4 is greater than the first length L1, and the fourth length L4 is less than a sum of two first lengths L1. In addition, two adjacent white sub-pixels SPW entirely overlap three of the first sub-pixels SP1 in the second direction D2, and two adjacent white sub-pixels SPW entirely overlap two of the second sub-pixels SP2 and one of the third sub-pixels SP3 in the second direction D2.

Figure 4:
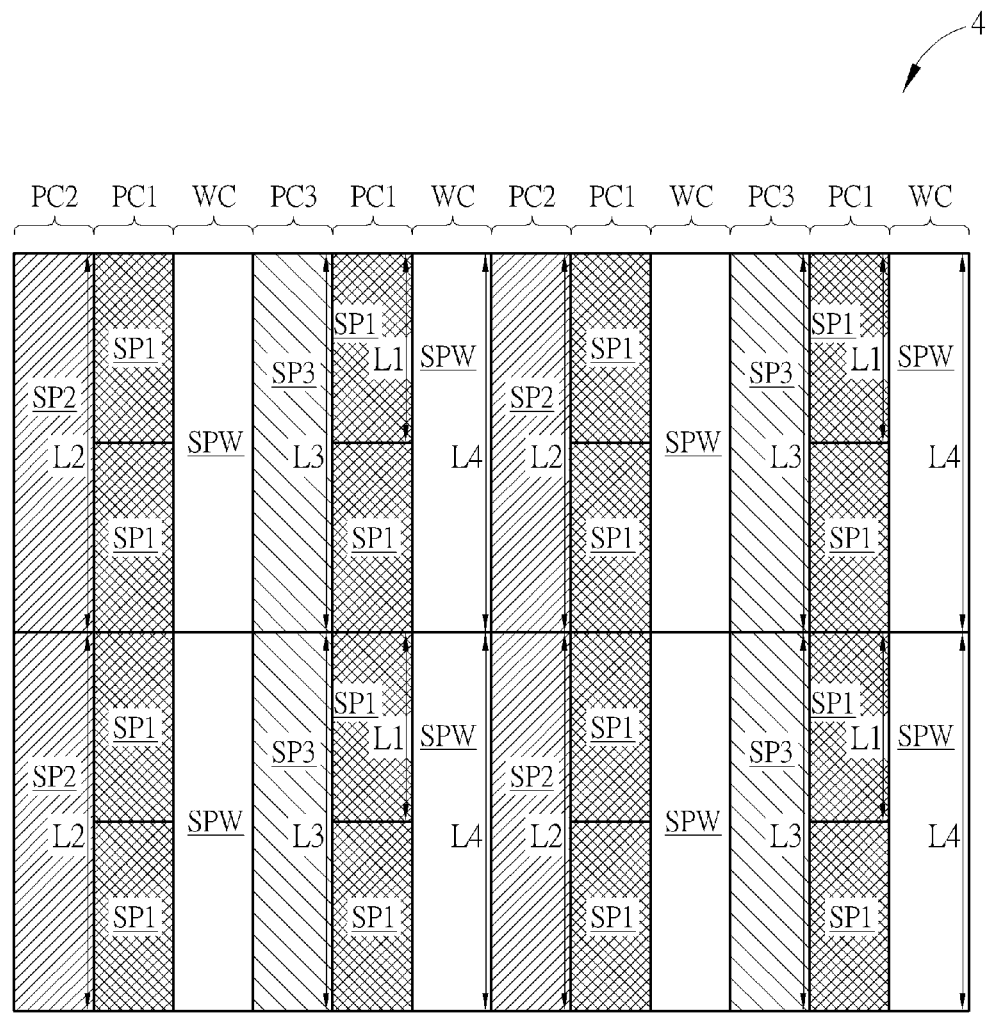
FIG. 4 is a schematic diagram illustrating a pixel arrangement of color display panel according to a fourth embodiment of the present invention.
Figure 4:
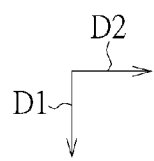

Refer to FIG. 4. FIG. 4 is a schematic diagram illustrating a pixel arrangement of color display panel according to a fourth embodiment of the present invention. As shown in FIG. 4, in the pixel arrangement 4 of color display panel of this embodiment, the first sub-pixels SP1 extend along the first direction D1 and form a plurality of first sub-pixel columns PC1 substantially arranged in parallel, the second sub-pixels SP2 extend along the first direction D1 and form a plurality of second sub-pixel columns PC2 arranged substantially in parallel, the third sub-pixels SP3 extend along the first direction D1 and form a plurality of third sub-pixel columns PC3 arranged substantially in parallel, and the white sub-pixels SPW extend along the first direction D1 and form a plurality of white sub-pixel columns WC arranged substantially in parallel. The first sub-pixel columns PC1, the second sub-pixel columns PC2, the third sub-pixel columns PC3 and the white sub-pixel columns WC are alternately and repeatedly arranged in a sequence of the second sub-pixel column PC2, the first sub-pixel column PC1, the white sub-pixel column WC, the third sub-pixel column PC3, the first sub-pixel column PC1 and the white sub-pixel column WC along a second direction D2 perpendicular to the first direction D1. Specifically, in the second direction D2, the 6n-5$^{th}$ sub-pixel columns are the second sub-pixel columns PC2, the 6n-4$^{th}$ sub-pixel columns and the 6n-1$^{th}$ sub-pixel columns are the first sub-pixel columns PC1, the 6n-3$^{th}$ sub-pixel columns and the 6n$^{th}$ sub-pixel columns are the white sub-pixel columns WC, and the 6n-2$^{th}$ sub-pixel columns are the third sub-pixel columns PC3, where n is integers greater than 1. In the first direction D1, all sub-pixels of the first sub-pixel columns PC1 are the first sub-pixels SP1, all sub-pixels of the white sub-pixel columns WC are the white sub-pixels SPW, all sub-pixels of the second sub-pixel columns PC2 are the second sub-pixels SP2, and all sub-pixels of the third sub-pixel columns PC3 are the third sub-pixels SP3. In addition, the second length L2 is substantially equal to the third length L3, the fourth length L4 is substantially equal to the third length L3, the fourth length L4 is greater than the first length L1, and a sum of two first lengths L1 is substantially equal to the fourth length L4. Also, two adjacent first sub-pixels SP1 entirely overlap one of the second sub-pixels SP2 in the second direction D2, two adjacent first sub-pixels SP1 entirely overlap one of the third sub-pixels SP3 in the second direction D2, and two adjacent first sub-pixels SP1 entirely overlap one of the white sub-pixels SPW in the second direction D2.

Figure 5:
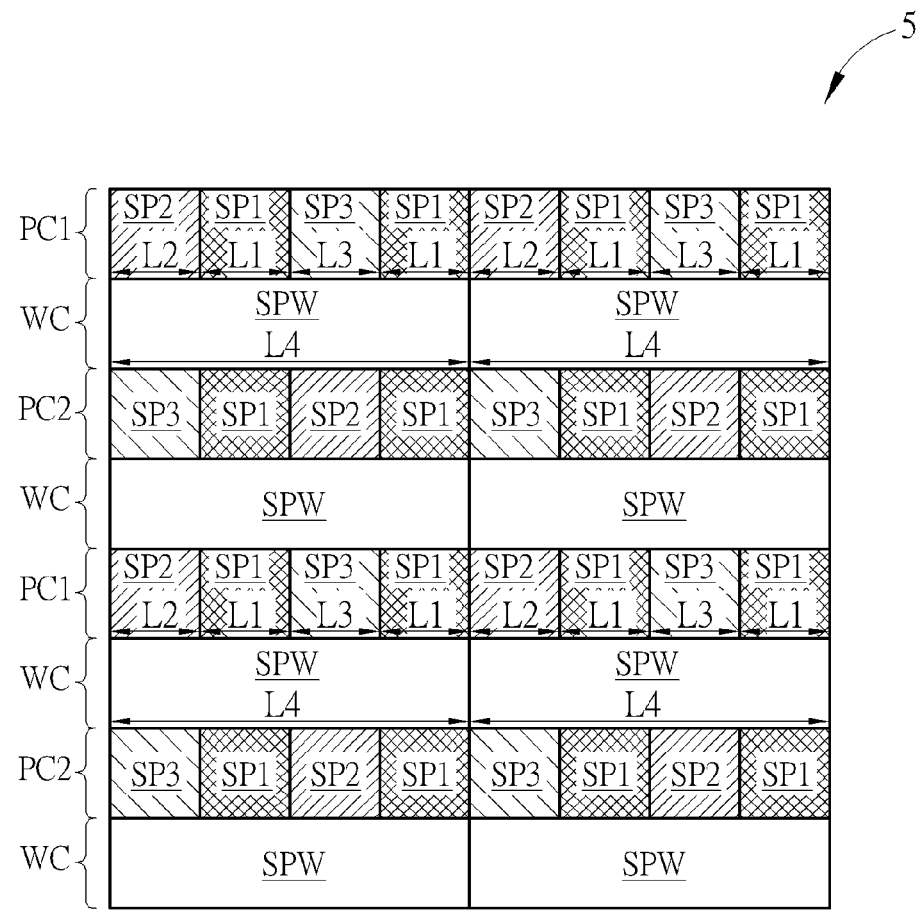
FIG. 5 is a schematic diagram illustrating a pixel arrangement of color display panel according to a fifth embodiment of the present invention.

Refer to FIG. 5. FIG. 5 is a schematic diagram illustrating a pixel arrangement of color display panel according to a fifth embodiment of the present invention. As shown in FIG. 5, the pixel arrangement 5 of color display panel of this embodiment includes a plurality of white sub-pixels SPW, first sub-pixels SP1, second sub-pixels SP2 and third sub-pixels SP3. The white sub-pixels SPW are configured to provide a white light, the first sub-pixels SP1 are configured to provide a first color light (e.g. a green light), the second sub-pixels SP2 are configured to provide a second color light (e.g. a red light) and the sub-pixels SP3 are configured to provide a third color light (e.g. a blue light). The white sub-pixels SPW extend along the first direction D1 and form a plurality of white sub-pixel columns WC, and the white sub-pixel SPW has a fourth length L4 in the first direction. The first sub-pixels SP1 are disposed between the white sub-pixel columns WC, and the first sub-pixel SP1 has a first length L1 in the first direction D1. The second sub-pixels SP2 are disposed between the white sub-pixel columns WC, and the second sub-pixel SP2 has a second length L2 in the first direction D1. The third sub-pixels are disposed between the white sub-pixel columns WC, and the third sub-pixel SP3 has a third length L3 in the first direction D1. In addition, a portion of the first sub-pixels SP1, the second sub-pixels SP2 and the third sub-pixels SP3 are arranged along the first direction D1 and form a plurality of first sub-pixel columns PC1 arranged substantially in parallel, where the first sub-pixels SP1, the second sub-pixels SP2 and the third sub-pixels SP3 of the first sub-pixel column PC1 are repeatedly arranged in a sequence of the second sub-pixel SP2, the first sub-pixel SP1, the third sub-pixel SP3 and the first sub-pixel SP1; the other portion of the first sub-pixels SP1, the second sub-pixels SP2 and the third sub-pixels SP3 are arranged along the first direction D1 and form a plurality of second sub-pixel columns PC2 arranged substantially in parallel, where the first sub-pixels SP1, the second sub-pixels SP2 and the third sub-pixels SP3 of the second sub-pixel column PC2 are repeatedly arranged in a sequence of the third sub-pixel SP3, the first sub-pixel SP1, the second sub-pixel SP2 and the first sub-pixel SP1. In this embodiment, the white sub-pixel columns WC, the first sub-pixel columns PC1 and the second sub-pixel columns PC2 are repeatedly arranged in a sequence of the first sub-pixel column PC1, the white sub-pixel column WC, the second sub-pixel column PC2 and the white sub-pixel column WC in the second direction D2. In the present invention, the first direction D1 and the second direction D2 are perpendicular to each other, but not limited thereto. The first direction D1 may be a row direction, and the second direction D2 may be a column direction, but not limited thereto. Specifically, in the second direction D2, the 4n-3$^{th}$ sub-pixel columns are the first sub-pixel columns PC1, the 4n-1$^{th}$ sub-pixel columns are the second sub-pixel columns PC2, and the 4n-2$^{th}$ sub-pixel columns and the 4n$^{th}$ sub-pixel columns are the white sub-pixel columns WC, where n is integers greater than 1.

In this embodiment, the first length L1 is substantially equal to the second length L2, the second length L2 is substantially equal to the third length L3, the fourth length L4 is greater than the first length L1, and the fourth length L4 is substantially equal to a sum of two first lengths L1, the second length L2 and the third length L3. In addition, the first sub-pixel SP1 of the first sub-pixel column PC1 entirely overlap the first sub-pixel SP1 of the second sub-pixel column PC2 in the second direction D2, the second sub-pixel SP2 of the first sub-pixel column PC1 entirely overlap the third sub-pixel SP3 of the second sub-pixel column PC2 in the second direction D2, and the white sub-pixel SPW entirely overlap two of the first sub-pixels SP1, one of the second sub-pixels SP2 and one of the third sub-pixels SP3 in the second direction D2.

Figure 6:
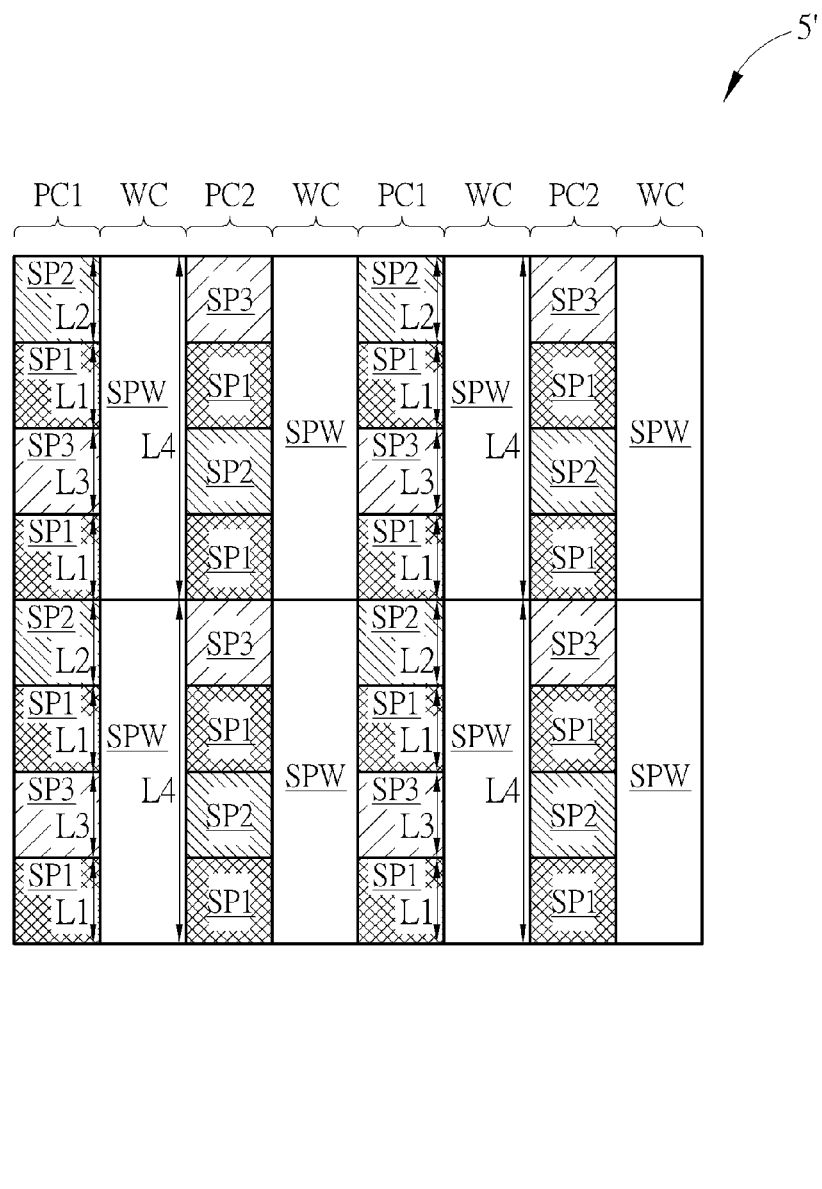
FIG. 6 is a schematic diagram illustrating a pixel arrangement of color display panel according to an alternative embodiment of the fifth embodiment of the present invention.

Refer to FIG. 6. FIG. 6 is a schematic diagram illustrating a pixel arrangement of color display panel according to an alternative embodiment of the fifth embodiment of the present invention. As shown in FIG. 6, the relative position of the first sub-pixel SP1, the second sub-pixel SP2, the third sub-pixel SP3 and the white sub-pixel SPW in the pixel arrangement 5' of color display panel in this alternative embodiment is similar to that of the fifth embodiment. In this alternative embodiment, the first direction D1 is a column direction, and the second direction D2 is a row direction.

Figure 7:
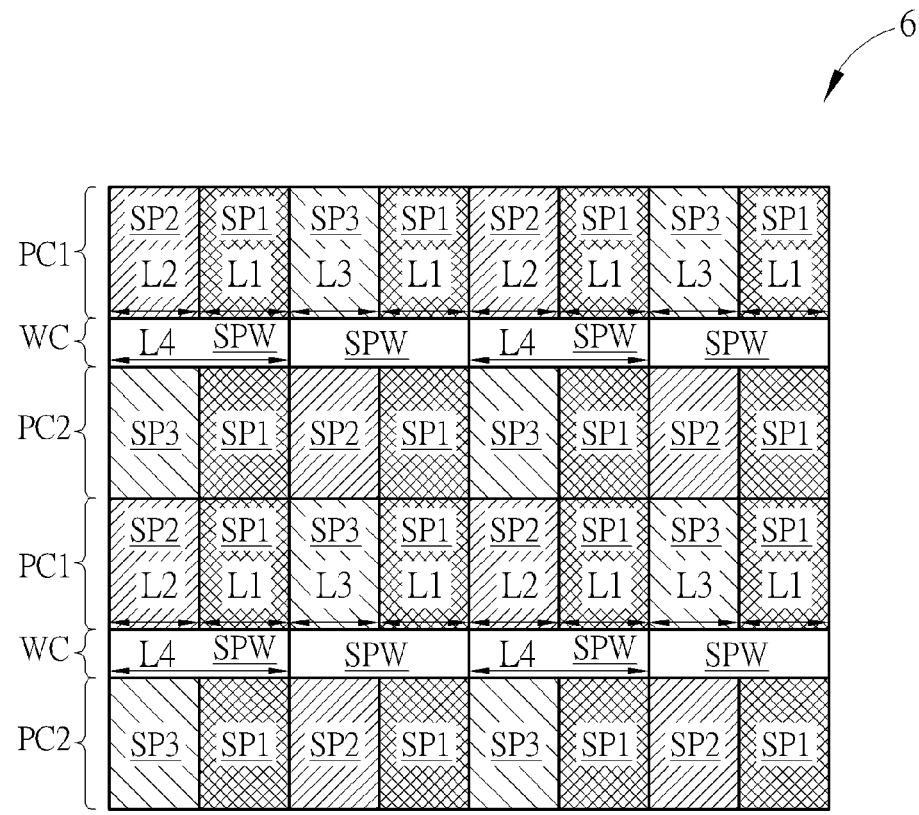
FIG. 7 is a schematic diagram illustrating a pixel arrangement of color display panel according to a sixth embodiment of the present invention.
Figure 7:
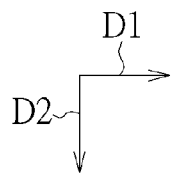

Refer to FIG. 7. FIG. 7 is a schematic diagram illustrating a pixel arrangement of color display panel according to a sixth embodiment of the present invention. As shown in FIG. 7, in the pixel arrangement 6 of color display panel of this embodiment, the white sub-pixel columns WC, the first sub-pixel columns PC1 and the second sub-pixel columns PC2 are repeatedly arranged in a sequence of the first sub-pixel column PC1, the white sub-pixel column WC and the second sub-pixel column PC2 in the second direction D2. Specifically, in the second direction D2, the 3n-2$^{th}$ sub-pixel columns are the first sub-pixel columns PC1, the 3n-1$^{th}$ sub-pixel columns are the white sub-pixel columns WC, and the 3n$^{th}$ sub-pixel columns are the second sub-pixel columns PC2, where n is integers greater than 1. In addition, the fourth length L4 is substantially equal to a sum of the first length L1 and the second length L2. Each of the white sub-pixels SPW entirely overlap one of the first sub-pixels SP1 and one of the second sub-pixels SP2 in the second direction D2, and each of the white sub-pixels SPW also entirely overlap one of the first sub-pixels SP1 and one of the third sub-pixels SP3 in the second direction D2. For example, one side of the white sub-pixel SPW entirely overlap one of the first sub-pixels SP1 and one of the second sub-pixels SP2 of the first sub-pixel column PC1 in the second direction D2, and the other side of the white sub-pixel SPW entirely overlap one of the first sub-pixels SP1 and one of the third sub-pixels SP3 of the second sub-pixel column PC 2 in the second direction D2. The first direction D1 is a row direction, and the second direction D2 is a column direction, but not limited thereto.

Figure 8:
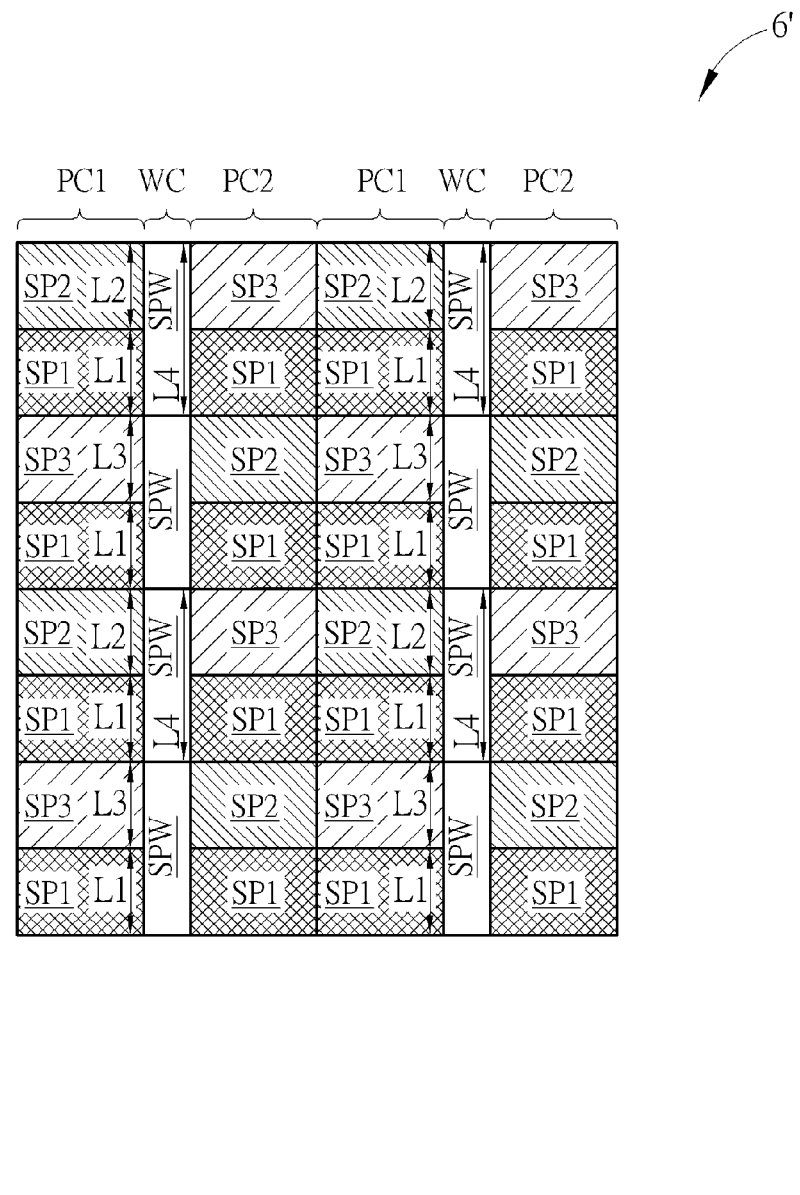
FIG. 8 is a schematic diagram illustrating a pixel arrangement of color display panel according to an alternative embodiment of the sixth embodiment of the present invention.

Refer to FIG. 8. FIG. 8 is a schematic diagram illustrating a pixel arrangement of color display panel according to an alternative embodiment of the sixth embodiment of the present invention. As shown in FIG. 8, the relative position of the first sub-pixel SP1, the second sub-pixel SP2, the third sub-pixel SP3 and the white sub-pixel SPW in the pixel arrangement 6' of color display panel in this alternative embodiment is similar to that of the sixth embodiment. In this alternative embodiment, the first direction D1 is a column direction, and the second direction D2 is a row direction.

Figure 9:
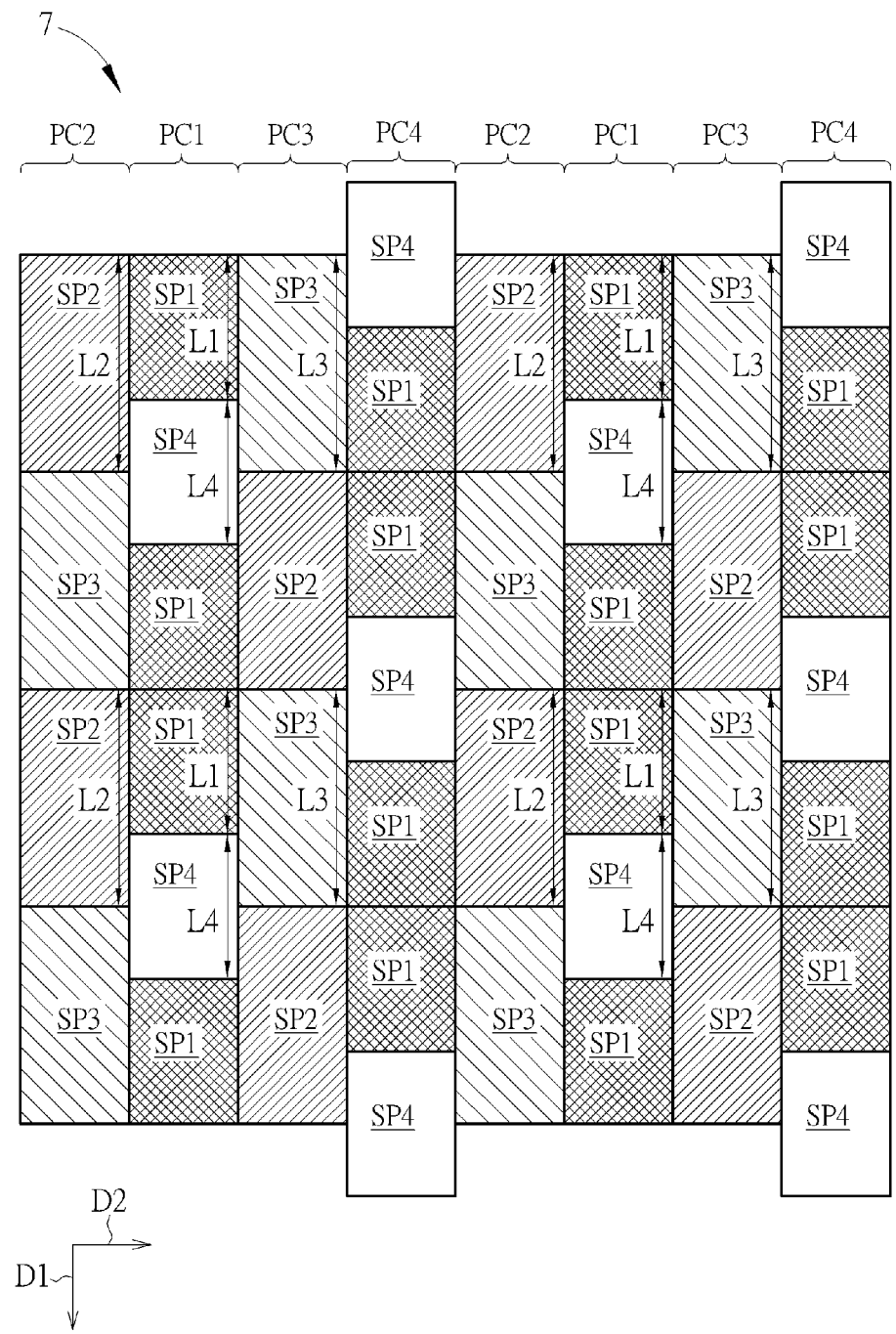
FIG. 9 is a schematic diagram illustrating a pixel arrangement of color display panel according to a seventh embodiment of the present invention.

Refer to FIG. 9. FIG. 9 is a schematic diagram illustrating a pixel arrangement of color display panel according to a seventh embodiment of the present invention. As shown in FIG. 9, the pixel arrangement 7 of color display panel of this embodiment includes a plurality of first sub-pixels SP1, second sub-pixels SP2, third sub-pixels SP3 and fourth sub-pixels SP4 configured to provide a first color light, a second color light, a third color light and a fourth color light, respectively. The first sub-pixel SP1 has a first length L1 in the first direction D1, the second sub-pixel SP2 has a second length L2 in the first direction D1, the third sub-pixel SP3 has a third length L3 in the first direction D1 and the fourth sub-pixel SP4 has a fourth length L4 in the first direction D1. The first length L1 is substantially equal to the fourth length L4, the second length L2 is substantially equal to the third length L3, and the second length L2 is greater than the first length L1. In this embodiment, the first color light is preferably a green light, the second color light is preferably a red light, the third color light is preferably a blue light and the fourth light is preferably a white light, i.e. the first sub-pixels SP1 are green sub-pixels, the second sub-pixels SP2 are red sub-pixels, the third sub-pixels SP3 are blue sub-pixels, and the fourth sub-pixels SP4 are white sub-pixels, but not limited thereto. In an alternative embodiment, the fourth color light may be another color light e.g. a yellow light, and the fourth sub-pixels SP4 may be yellow sub-pixels. In still another embodiment, the fourth color light may be a whitish light e.g. a yellowish white light or a blueish white light. The first sub-pixels SP1, the second sub-pixels SP2, the third sub-pixels SP3 and the fourth sub-pixels SP4 are arranged in the following manner. A portion of the first sub-pixels SP1 and a portion of the fourth sub-pixels SP4 are arranged along the first direction D1 and form a plurality of first sub-pixel columns PC1, and the first sub-pixels SP1 and the fourth sub-pixels SP4 of the first sub-pixel column PC1 are repeatedly arranged in a sequence of the first sub-pixel SP1, the fourth sub-pixel SP4 and the first sub-pixel SP1 in the first direction D1. The other portion of the first sub-pixels SP1 and the other portion of the fourth sub-pixels SP4 are arranged along the first direction D1 and form a plurality of fourth sub-pixel columns PC4, and the first sub-pixels SP1 and the fourth sub-pixels SP4 of the fourth sub-pixel column PC4 are repeatedly arranged in a sequence of the first sub-pixel SP1, the fourth sub-pixel SP4 and the first sub-pixel SP1 in the first direction D1. In addition, any one of the first sub-pixels SP1 of the first sub-pixel column PC1 partially overlaps one of the first sub-pixels SP1 and one of the fourth sub-pixels SP4 of the fourth sub-pixel column PC4 in the second direction D2 perpendicular to the first direction D1. A portion of the second sub-pixels SP2 and a portion of the third sub-pixels SP3 are arranged along the first direction D1 and form a plurality of second sub-pixel columns PC2, and the second sub-pixels SP2 and the third sub-pixels SP3 of the second sub-pixel column PC2 are repeatedly arranged in a sequence of the second sub-pixel SP2 and the third sub-pixel SP3 in the first direction D1. The other portion of the second sub-pixels SP2 and the other portion of the third sub-pixels SP3 are arranged along the first direction D1 and form a plurality of third sub-pixel columns PC3, and the second sub-pixels SP2 and the third sub-pixels SP3 of the third sub-pixel column PC3 are repeatedly arranged in a sequence of the third sub-pixel SP3 and the second sub-pixel SP2 in the first direction D1. In addition, the first sub-pixel columns PC1, the second sub-pixel columns PC2, the third sub-pixel columns PC 3 and the fourth sub-pixel columns PC4 are repeatedly arranged in a sequence of the second sub-pixel column PC2, the first sub-pixel column PC1, the third sub-pixel column PC3 and the fourth sub-pixel column PC 4 in the second direction D2. Specifically, in the second direction D2, the $4n\text{-}3^{th}$ sub-pixel columns are the second sub-pixel columns PC2, the $4n\text{-}2^{th}$ sub-pixel columns are the first sub-pixel columns PC1, the $4n\text{-}1^{th}$ sub-pixel columns are the third sub-pixel column PC3 and the $4n^{th}$ sub-pixel columns are the fourth sub-pixel columns PC4, where n is integers greater than 1. In the first direction D1, the $3m\text{-}2^{th}$ sub-pixels and the $3\ m^{th}$ sub-pixels of the first sub-pixel columns PC1 are the first sub-pixels SP1, and the $3m\text{-}1^{th}$ sub-pixels of the first sub-pixel columns PC1 are the fourth sub-pixels SP4; the $2m\text{-}1^{th}$ sub-pixels of the second sub-pixel columns PC2 are the second sub-pixels SP2, and the $2\ m^{th}$ sub-pixels of the second sub-pixel columns PC2 are the third sub-pixels SP3; the $2m\text{-}1^{th}$ sub-pixels of the third sub-pixel columns PC3 are the third sub-pixels SP3, and the $2\ m^{th}$ sub-pixels of the third sub-pixel columns PC3 are the second sub-pixels SP2; the $3m\text{-}2^{th}$ sub-pixels and the $3\ m^{th}$ sub-pixels of the fourth sub-pixel columns PC4 are the first sub-pixels SP1, and the $3m\text{-}1^{th}$ sub-pixels of the fourth sub-pixel columns PC4 are the fourth sub-pixels SP4, where m is integers greater than 1.

It is noted that the first sub-pixel column PC1 and the fourth sub-pixel column PC4 are both composed of the first sub-pixels SP1 and the fourth sub-pixels SP4, and the first sub-pixels SP1 and the fourth sub-pixels SP4 are arranged in the same sequence; however, the first sub-pixels SP1 and the fourth sub-pixels SP4 of the fourth sub-pixel column PC4 is shifted in the first direction D1 with respect to the first sub-pixels SP1 and the fourth sub-pixels SP4 of the first sub-pixel column PC1, and the shifted length is less than the first length L1 or the fourth length L4. In other words, in the second direction D2, the first sub-pixel SP1 of the first sub-pixel column PC1 partially overlaps the first sub-pixel SP1 and the fourth sub-pixel SP4 of the fourth sub-pixel column PC4, and the fourth sub-pixel SP4 of the first sub-pixel column PC1 partially overlaps the first sub-pixel SP1 and the fourth sub-pixel SP4 of the fourth sub-pixel column PC4.

In this embodiment, a sum of two second lengths L2 is substantially equal to a sum of three first lengths L1, each of the second sub-pixel SP2 of the second sub-pixel column PC2 entirely overlaps one of the third sub-pixels SP3 of the third sub-pixel column PC3 in the second direction D2, each of the third sub-pixel SP3 of the second sub-pixel column PC2 entirely overlaps one of the second sub-pixels SP2 of the third sub-pixel column PC3 in the second direction D2. In addition, two of the first sub-pixels SP1 and one of fourth sub-pixels SP4 of the first sub-pixel column PC1 entirely overlap one of the second sub-pixels SP2 and one of the third sub-pixels SP3 of the second sub-pixel column PC2 in the second direction D2, the first sub-pixel SP1 of the fourth sub-pixel column PC4 does not entirely overlap the first sub-pixel SP1 and the fourth sub-pixel SP4 of the first sub-pixel column PC1, the second sub-pixel SP2 and the third sub-pixel SP3 of the second sub-pixel column PC2 and the second sub-pixel SP2 and the third sub-pixel SP3 of the third sub-pixel column PC3 in the second direction D2.

In this embodiment, each of the first sub-pixels SP1, the second sub-pixels SP2, the third sub-pixels SP3 and the fourth sub-pixels SP4 is a rectangular sub-pixel, where the first length L1 is a distance between two opposite sides of the first sub-pixel SP1 in the first direction D1, the second length L2 is a distance between two opposite sides of the second sub-pixel SP2 in the first direction D1, the third length L3 is a distance between two opposite sides of the third sub-pixel SP3 in the first direction D1, and the fourth length L4 is a distance between two opposite sides of the fourth sub-pixel SP4 in the first direction D1.

Figure 10:
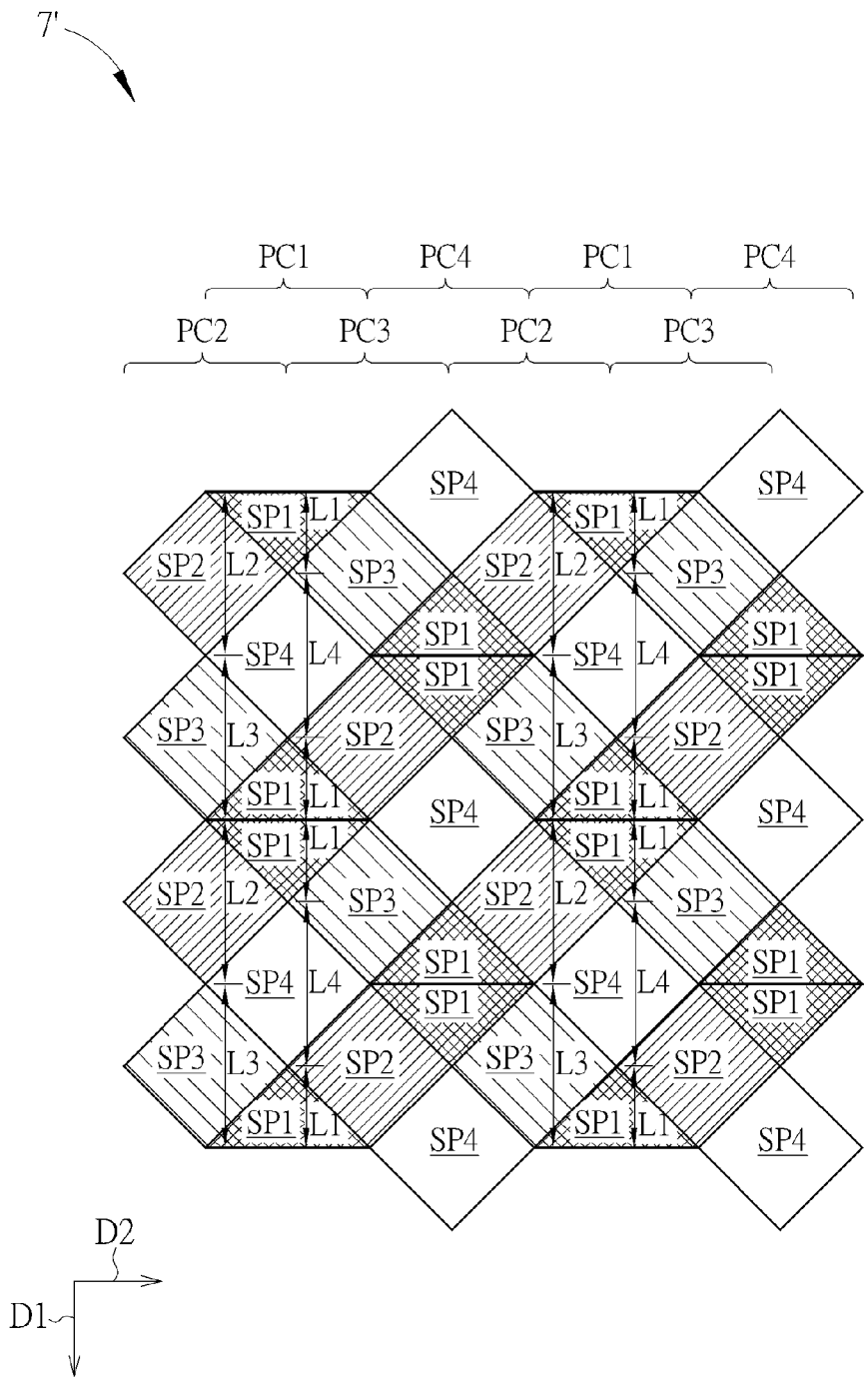
FIG. 10 is a schematic diagram illustrating a pixel arrangement of color display panel according to an alternative embodiment of the seventh embodiment of the present invention.

Refer to FIG. 10. FIG. 10 is a schematic diagram illustrating a pixel arrangement of color display panel according to an alternative embodiment of the seventh embodiment of the present invention. As shown in FIG. 10, the relative position of the first sub-pixel SP1, the second sub-pixel SP2, the third sub-pixel SP3 and the fourth sub-pixel SP4 in the pixel arrangement 7' of color display panel in this alternative embodiment is similar to that of the seventh embodiment. In this alternative embodiment, each of the first sub-pixels SP1 is a triangular sub-pixel (e.g. an isosceles triangular sub-pixel), and two first sub-pixels SP1 adjacent in the first direction D1 form a rhombus. Each of the second sub-pixels SP2, the third sub-pixels SP3 and the fourth sub-pixels SP4 is a rhombus sub-pixel. The first length L1 is a distance between a vertex and an opposite side of the first sub-pixel SP1 in the first direction D1, the second length L2 is a distance between two opposite vertices of the second sub-pixel SP2 in the first direction D1, the third length L3 is a distance between two opposite vertices of the third sub-pixel SP3 in the first direction D1, and the fourth length L4 is a distance between two opposite vertices of the fourth sub-pixel SP4 in the first direction D1.

The pixel arrangement of color display panel of the present invention is able to support pixel rendering and/or white sharing display. Pixel rendering (also referred to as sub-pixel rendering, SPR) is a mechanism in which a plurality of adjacent pixel units can share the same second sub-pixel and/or the same third sub-pixel; white sharing is a mechanism in which a plurality of adjacent pixel units can share the same white sub-pixel. Accordingly, the pixel arrangement of color display panel of the present invention includes four types of sub-pixels for providing different color lights including the first sub-pixels, the second sub-pixels, the third sub-pixels and the white sub-pixels, but the resolution is not reduced.

Figure 11:
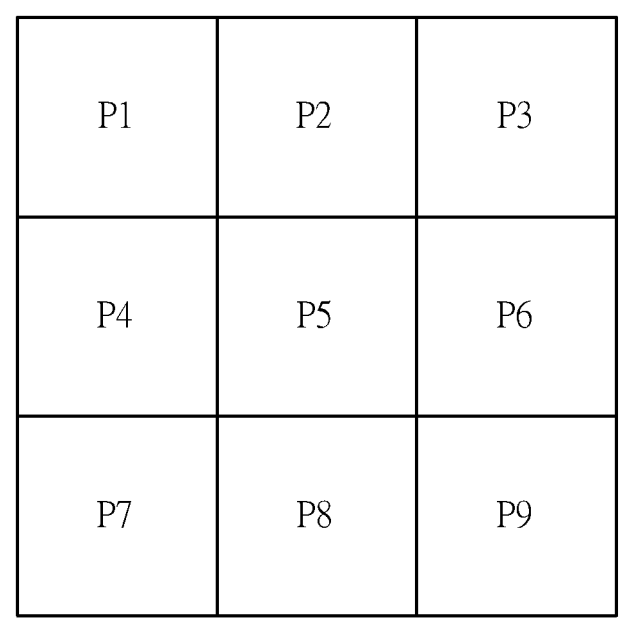

Refer to FIG. 11. FIG. 11 is a schematic diagram illustrating nine adjacent pixel units of the pixel arrangement of color display panel of the present invention. As shown in FIG. 11, the pixel arrangement of color display panel of the present invention includes nine adjacent pixel units P1-P9 arranged as a 3*3 array. When displaying, the color display panel will receive an original image data, which includes nine groups of image data, and each group of data includes a green light grayscale value, a red light grayscale value, a blue light grayscale value and a white light grayscale value.

The number and shape of the sub-pixels of the pixel units P1-P9 may be different in the pixel arrangement of color display panel of different embodiments. In the following description, two adjacent pixel units of the pixel arrangement of color display panel of the first embodiment is selected as an example to illustrate pixel rendering and white sharing. As shown in FIG. 1 and FIG. 11, the pixel arrangement 1 of color display panel includes a plurality of pixel units, where each of the pixel units P1-P9 is composed of one second sub-pixel SP2 and/or one third sub-pixel SP3 disposed adjacent to each other of the second sub-pixel column PC2 (or one second sub-pixels SP2 and/or one third sub-pixel SP3 disposed adjacent to each other of the third sub-pixel column PC3), one first sub-pixel SP1 of the first sub-pixel column PC1 and one white sub-pixel SPW of the white sub-pixel column WC.

The pixel unit P5 and the pixel unit P6 are two adjacent pixel units in the second direction D2. The pixel unit P5 and the pixel unit P6 share the same second sub-pixel SP2 and the same third sub-pixel SP3, and thus the common second sub-pixel SP2 and/or the common third sub-pixel SP3 may perform pixel rendering. When the pixel unit P5 is composed of the third sub-pixel SP3 of the second sub-pixel column PC2, the first sub-pixel SP1 of the first sub-pixel column PC1 and the white sub-pixel SPW of the white sub-pixel column WC, and when the pixel unit P6 is composed of the second sub-pixel SP2 of the second sub-pixel PC2, the first sub-pixel SP1 of the first sub-pixel column PC1 and the white sub-pixel SPW of the white sub-pixel column WC, the actually-displayed red light grayscale value of the second sub-pixel SP2 of the pixel unit P6 is determined by both the red light grayscale value of the pixel unit P5 and the red light grayscale value of the pixel unit P6. For example, the actually-displayed red light grayscale value of the second sub-pixel SP2 of the pixel unit P6 may be the mean value or the minimum value of the red light grayscale value of the pixel unit P5 and the red light grayscale value of the pixel unit P6, or any value calculated by different algorithms that can significantly reflect the red light grayscale value of the pixel unit P5 and the red light grayscale value of the pixel unit P6. Similarly, when the pixel unit P5 is composed of the second sub-pixel SP2 of the second sub-pixel column PC2, the first sub-pixel SP1 of the first sub-pixel column PC1 and the white sub-pixel SPW of the white sub-pixel column WC, and when the pixel unit P6 is composed of the third sub-pixel SP3 of the second sub-pixel PC2, the first sub-pixel SP1 of the first sub-pixel column PC1 and the white sub-pixel SPW of the white sub-pixel column WC, the actually-displayed blue light grayscale value of the third sub-pixel SP3 of the pixel unit P6 is determined by both the blue light grayscale value of the pixel unit P5 and the blue light grayscale value of the pixel unit P6. For example, the actually-displayed blue light grayscale value of the third sub-pixel SP3 of the pixel unit P6 may be the mean value or the minimum value of the blue light grayscale value of the pixel unit P5 and the blue light grayscale value of the pixel unit P6, or any value calculated by different algorithms that can significantly reflect the blue light grayscale value of the pixel unit P5 and the blue light grayscale value of the pixel unit P6.

In addition, the pixel unit P5 and the pixel unit P8 are two adjacent pixel units in the first direction D1. If the white light grayscale value of the pixel unit P5 is not zero and the white light grayscale value of the pixel unit P8 is not zero, white sharing can be performed. Meanwhile, the actually-displayed white light grayscale value of the white sub-pixel SPW shared by the pixel unit P5 and the pixel unit P8 may be the mean value or the minimum value of the white light grayscale value of the pixel unit P5 and the white light grayscale value of the pixel unit P8, or any value calculated by different algorithms that can significantly reflect the white light grayscale value of the pixel unit P5 and the white light grayscale value of the pixel unit P8. If one of the white light grayscale value of the pixel unit P5 and the white light grayscale value of the pixel unit P8 is zero, white sharing is not performed. For example, if the white light grayscale value of the pixel unit P5 is zero and the white light grayscale value of the pixel unit P8 is not zero, the actually-displayed white light grayscale value of the white sub-pixel SPW shared by the pixel unit P5 and the pixel unit P8 is zero, i.e. both the pixel unit P5 and the pixel unit P8 provide red light, green light and blue light without white light. In such a case, pixel rendering can still be performed on the second sub-pixel SP2 and/or the third sub-pixel SP3. Similarly, if the white light grayscale value of the pixel unit P5 is not zero and the white light grayscale value of the pixel unit P8 is zero, the actually-displayed white light grayscale value of the white sub-pixel SPW shared by the pixel unit P5 and the pixel unit P8 is zero, i.e. both the pixel unit P5 and the pixel unit P8 provide red light, green light and blue light without white light. In such a case, pixel rendering can still be performed on the second sub-pixel SP2 and/or the third sub-pixel SP3.

In the following description, two adjacent pixel units of the pixel arrangement 6' of color display panel of the sixth embodiment are selected as another example to illustrate pixel rendering and white sharing. As shown in FIG. 8 and FIG. 11, the pixel arrangement 6' of color display panel includes a plurality of pixel units, where each of the pixel units P1-P9 is composed of one first sub-pixel SP1, one second sub-pixel SP2 and/or one third sub-pixel SP3 disposed adjacent to each other of the first sub-pixel column PC1 (or one first sub-pixel SP1, one second sub-pixel SP2 and/or one third sub-pixel SP3 disposed adjacent to each other of the second sub-pixel column PC2), and one white sub-pixel SPW of the white sub-pixel column WC.

The pixel unit P5 and the pixel unit P8 are two adjacent pixel units in the first direction D1. The pixel unit P5 and the pixel unit P8 share the same second sub-pixel SP2 and the same third sub-pixel SP3, and thus the common second sub-pixel SP2 and/or the common third sub-pixel SP3 may perform pixel rendering. When the pixel unit P5 is composed of the third sub-pixel SP3 and the first sub-pixel SP1 of the first sub-pixel column PC1 and the white sub-pixel SPW of the white sub-pixel column WC, and when the pixel unit P8 is composed of the second sub-pixel SP2 and the first sub-pixel SP1 of the first sub-pixel column PC1 and the white sub-pixel SPW of the white sub-pixel column WC, the actually-displayed red light grayscale value of the second sub-pixel SP2 of the pixel unit P8 is determined by both the red light grayscale value of the pixel unit P5 and the red light grayscale value of the pixel unit P8. For example, the actually-displayed red light grayscale value of the second sub-pixel SP2 of the pixel unit P8 may be the mean value or the minimum value of the red light grayscale value of the pixel unit P5 and the red light grayscale value of the pixel unit P8, or any value calculated by different algorithms that can significantly reflect the red light grayscale value of the pixel unit P5 and the red light grayscale value of the pixel unit P8. Similarly, when the pixel unit P5 is composed of the second sub-pixel SP2 and the first sub-pixel SP1 of the first sub-pixel column PC1 and the white sub-pixel SPW of the white sub-pixel column WC, and when the pixel unit P8 is composed of the third sub-pixel SP3 and the first sub-pixel SP1 of the first sub-pixel column PC1 and the white sub-pixel SPW of the white sub-pixel column WC, the actually-displayed blue light grayscale value of the third sub-pixel SP3 of the pixel unit P8 is determined by both the blue light grayscale value of the pixel unit P5 and the blue light grayscale value of the pixel unit P8. For example, the actually-displayed blue light grayscale value of the third sub-pixel SP3 of the pixel unit P8 may be the mean value or the minimum value of the blue light grayscale value of the pixel unit P5 and the blue light grayscale value of the pixel unit P8, or any value calculated by different algorithms that can significantly reflect the blue light grayscale value of the pixel unit P5 and the blue light grayscale value of the pixel unit P8.

In addition, the pixel unit P5 and the pixel unit P6 are two adjacent pixel units in the second direction D2. If the white light grayscale value of the pixel unit P5 is not zero and the white light grayscale value of the pixel unit P6 is not zero, white sharing can be performed. Meanwhile, the actually-displayed white light grayscale value of the white sub-pixel SPW shared by the pixel unit P5 and the pixel unit P6 may be the mean value or the minimum value of the white light grayscale value of the pixel unit P5 and the white light grayscale value of the pixel unit P6, or any value calculated by different algorithms that can significantly reflect the white light grayscale value of the pixel unit P5 and the white light grayscale value of the pixel unit P6. If one of the white light grayscale value of the pixel unit P5 and the white light grayscale value of the pixel unit P6 is zero, white sharing is not performed. For example, if the white light grayscale value of the pixel unit P5 is zero and the white light grayscale value of the pixel unit P6 is not zero, the actually-displayed white light grayscale value of the white sub-pixel SPW shared by the pixel unit P5 and the pixel unit P6 is zero, i.e. both the pixel unit P5 and the pixel unit P6 provide red light, green light and blue light without white light. In such a case, pixel rendering can still be performed on the second sub-pixel SP2 and/or the third sub-pixel SP3. Similarly, if the white light grayscale value of the pixel unit P5 is not zero and the white light grayscale value of the pixel unit P6 is zero, the actually-displayed white light grayscale value of the white sub-pixel SPW shared by the pixel unit P5 and the pixel unit P6 is zero, i.e. both the pixel unit P5 and the pixel unit P6 provide red light, green light and blue light without white light. In such a case, pixel rendering can still be performed on the second sub-pixel SP2 and/or the third sub-pixel SP3

In the aforementioned embodiments, pixel rendering and white sharing mechanisms are illustrated in two adjacent pixel unit P5 and pixel unit P6 or pixel unit P5 and pixel unit P8. In the pixel arrangement of color display panel of all the embodiments, pixel rendering and/or white sharing can be performed on any one pixel unit and at least another one pixel unit adjacently disposed. Also, the definition (composition) of the pixel unit may be modified based on different algorithms in different embodiments.

The pixel arrangement of color display panel of the present invention can be applied to various types of color display panel. The color display panel may be a non-self-luminous display panel or self-luminous display panel, where the non-self-luminous display panel may include a liquid crystal display panel, an electrophoretic display panel, an electrowetting display panel and other suitable non-self-luminous display panels; the self-luminous display panel may include an organic light-emitting diode (OLED) display panel, a plasma display panel, a field emission display panel or other self-luminous display panels.

In conclusion, the pixel arrangement of color display panel of the present invention includes green sub-pixels, red sub-pixels, blue sub-pixels and white sub-pixels, and adjacent pixel units shares at least one sub-pixel. Consequently, the brightness can be increased through white sub-pixels without sacrificing resolution. In addition, the pixel arrangement of color display panel of the present invention is able to support pixel rendering and/or white sharing mechanisms.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A pixel arrangement of color display panel, comprising:
a plurality of first sub-pixels, configured to provide a first color light, wherein the first sub-pixel has a first length in a first direction;
a plurality of second sub-pixels, configured to provide a second color light, wherein the second sub-pixel has a second length in the first direction;
a plurality of third sub-pixels, configured to provide a third color light, wherein the third sub-pixel has a third length in the first direction; and
a plurality of fourth sub-pixels configured to provide a fourth light, wherein the fourth sub-pixel has a fourth length in the first direction, the first length is substantially equal to the fourth length, the second length is substantially equal to the third length, and the second length is greater than the first length, wherein
a portion of the first sub-pixels and a portion of the fourth sub-pixels are arranged along the first direction and form a plurality of first sub-pixel columns, and the first sub-pixels and the fourth sub-pixels of the first sub-pixel column are repeatedly arranged in a sequence of the first sub-pixel, the fourth sub-pixel and the first sub-pixel in the first direction,
the other portion of the first sub-pixels and the other portion of the fourth sub-pixels are arranged along the first direction and form a plurality of fourth sub-pixel columns, and the first sub-pixels and the fourth sub-pixels of the fourth sub-pixel column are repeatedly arranged in a sequence of the first sub-pixel, the fourth sub-pixel and the first sub-pixel in the first direction, and any one of the first sub-pixels of the first sub-pixel column partially overlaps one of the first sub-pixels and one of the fourth sub-pixels of the fourth sub-pixel column in a second direction perpendicular to the first direction,
a portion of the second sub-pixels and a portion of the third sub-pixels are arranged along the first direction and form a plurality of second sub-pixel columns, and the second sub-pixels and the third sub-pixels of the second sub-pixel column are repeatedly arranged in a sequence of the second sub-pixel and the third sub-pixel in the first direction,
the other portion of the second sub-pixels and the other portion of the third sub-pixels are arranged along the first direction and form a plurality of third sub-pixel columns, and the second sub-pixels and the third sub-pixels of the third sub-pixel column are repeatedly arranged in a sequence of the third sub-pixel and the second sub-pixel in the first direction, and
wherein the first sub-pixel columns, the second sub-pixel columns, the third sub-pixel columns and the fourth sub-pixel columns are repeatedly arranged in a sequence of the second sub-pixel column, the first sub-pixel column, the third sub-pixel column and the fourth sub-pixel column in the second direction.

2. The pixel arrangement of color display panel of claim 1, wherein the first color light is a green light, the second color light is a red light, the third color light is a blue light and the fourth light is a yellow light, a white light, a yellowish white light or a blueish white light.

3. The pixel arrangement of color display panel of claim 1, wherein a sum of two second lengths is substantially equal to a sum of three first lengths, each of the second sub-pixel of the second sub-pixel column entirely overlaps one of the third sub-pixels of the third sub-pixel column in the second direction, each of the third sub-pixel of the second sub-pixel column entirely overlaps one of the second sub-pixels of the third sub-pixel column in the second direction, two of the first sub-pixels and one of fourth sub-pixels of the first sub-pixel column entirely overlap one of the second sub-pixels and one of the third sub-pixels of the second sub-pixel column in the second direction, the first sub-pixel of the fourth sub-pixel column does not entirely overlap the first sub-pixel and the fourth sub-pixel of the first sub-pixel column, the second sub-pixel and the third sub-pixel of the second sub-pixel column and the second sub-pixel and the third sub-pixel of the third sub-pixel column in the second direction.

4. The pixel arrangement of color display panel of claim 1, wherein each of the first sub-pixels, the second sub-pixels, the third sub-pixels and the fourth sub-pixels is a rectangular sub-pixel, the first length is a distance between two opposite sides of the first sub-pixel in the first direction, the second length is a distance between two opposite sides of the second sub-pixel in the first direction, the third length is a distance between two opposite sides of the third sub-pixel in the first direction, and the fourth length is a distance between two opposite sides of the fourth sub-pixel in the first direction.

5. The pixel arrangement of color display panel of claim 1, wherein each of the first sub-pixels is a triangular sub-pixel, each of the second sub-pixels, the third sub-pixels and the fourth sub-pixels is a rhombus sub-pixel, the first length is a distance between a vertex and an opposite side of the first sub-pixel in the first direction, the second length is a distance between two opposite vertices of the second sub-pixel in the first direction, the third length is a distance between two opposite vertices of the third sub-pixel in the first direction, and the fourth length is a distance between two opposite vertices of the fourth sub-pixel in the first direction.

* * * * *